(12) United States Patent
Nishiwaki

(10) Patent No.: US 7,579,652 B2
(45) Date of Patent: Aug. 25, 2009

(54) SEMICONDUCTOR DEVICE HAVING A HIGH WITHSTAND VOLTAGE

(75) Inventor: Katsuhiko Nishiwaki, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 296 days.

(21) Appl. No.: 10/562,839

(22) PCT Filed: Jun. 10, 2004

(86) PCT No.: PCT/JP2004/008516

§ 371 (c)(1), (2), (4) Date: Dec. 29, 2005

(87) PCT Pub. No.: WO2005/010996

PCT Pub. Date: Feb. 3, 2005

(65) Prior Publication Data

US 2006/0163653 A1   Jul. 27, 2006

(30) Foreign Application Priority Data

Jul. 11, 2003   (JP) .............................. 2003-195498

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .............................. 257/341; 257/E29.027; 257/E29.118; 257/E29.129

(58) Field of Classification Search .................. 257/341, 257/E29.027, E29.118, E29.129
See application file for complete search history.

(56) References Cited

U.S. PATENT DOCUMENTS

| 4,809,045 A | * | 2/1989 | Yilmaz ........................ 257/341 |
| 5,304,831 A | * | 4/1994 | Yilmaz et al. ............... 257/341 |
| 5,451,531 A | | 9/1995 | Yamaguchi et al. |
| 5,753,942 A | | 5/1998 | Seok |
| 5,866,931 A | | 2/1999 | Bulucea et al. |

(Continued)

FOREIGN PATENT DOCUMENTS

EP   1 093 168 A2   4/2001

(Continued)

OTHER PUBLICATIONS

English translation of Notification of Reason(s) for Refusal, Appln. No. 2003-195498 issued Oct. 16, 2007.

*Primary Examiner*—Howard Weiss
(74) *Attorney, Agent, or Firm*—Kenyon & Kenyon LLP

(57) ABSTRACT

To present a semiconductor device capable of operating stably even at large current, by lessening current concentration into the corners of contact opening after switching off and suppressing local heat generation without raising the ON voltage. In an insulated gate transistor divided by P field region 111 and gate electrode 106, having N+ emitter region 104 and P+ emitter region 100, and controlling conduction between emitter and collector by voltage applied to gate electrode 106, the shape of contact opening 108 contacting emitter (N+ emitter region 104 and P+ emitter region 100) and emitter electrode is formed of curved lines at four corners. Hence, eliminating right-angle apex, hole current from the field region into the emitter electrode after switching off is prevented from concentrating at one point.

6 Claims, 11 Drawing Sheets

U.S. PATENT DOCUMENTS

| | | | |
|---|---|---|---|
| 6,008,092 | A | 12/1999 | Gould |
| 6,271,562 | B1 | 8/2001 | Deboy et al. |
| 6,452,228 | B1 | 9/2002 | Okuno et al. |
| 6,459,128 | B1 * | 10/2002 | Kunori et al. ............... 257/368 |

FOREIGN PATENT DOCUMENTS

| | | |
|---|---|---|
| JP | 05-090595 | 4/1993 |
| JP | 10-229191 | 8/1998 |
| JP | 2000-269489 | 9/2000 |

* cited by examiner

PRIOR ART

PRIOR ART

PRIOR ART

PRIOR ART

SEMICONDUCTOR DEVICE HAVING A HIGH WITHSTAND VOLTAGE

This is a 371 national phase application of PCT/JP2004/008516 filed 10 Jun. 2004, claiming priority to Japanese Patent Application No. 2003-195498 filed 11 Jul. 2003, the contents of which are incorporated herein by reference.

TECHNICAL FIELD

The present invention relates to a semiconductor device of high withstand voltage suited to switching of large current. More particularly, it relates to a semiconductor device intended to prevent overheating when switching off.

BACKGROUND ART

As conventional semiconductor devices, insulated gate semiconductor devices disclosed in patent references 1 and 2 are known. In these insulated gate semiconductor devices, by applying a gate voltage to an insulated gate, a field effect is produced in a channel region in a semiconductor substrate, and current flows between emitter and collector. Accordingly, a contact opening is provided in order to exchange carriers between an emitter region and an emitter electrode. A typical example of this kind of insulated gate semiconductor device has a structure as shown in FIG. 18 to FIG. 20. FIG. 18 and FIG. 20 are longitudinal sectional views, and FIG. 19 is a plan sectional view of level A-A in these drawings. FIG. 18 is a sectional view of position B-B in FIG. 19 and FIG. 20. FIG. 20 is a sectional view of position C-C in FIG. 18 and FIG. 19.

In the insulated gate semiconductor device shown in FIG. 18 to FIG. 20, on the principal plane of level A-A side of semiconductor substrate, N+ emitter region 904 and P+ emitter region 900 are provided. Contacting with the lower part of them, P body region 903 is disposed. Further beneath the P body region 903, N drift region 902 is provided, and P+ collector region 901 is provided furthermore beneath. So far is within a semiconductor substrate (in this specification, the entire semiconductor single crystal of a start wafer and a layer formed by epitaxial growth on its surface is called a semiconductor substrate). In the semiconductor substrate, still more, P field regions 911 for dividing individual devices are formed from the level A-A side. Bottoms of the P field regions 911 reach into the N drift region 902.

Part of the semiconductor substrate is dug in from the level A-A side, and gate electrodes 906 are provided in the cavity. Gate electrodes 906 are insulated from the regions within the semiconductor substrate by gate insulating films 905. Above the semiconductor substrate, emitter electrode 909 and gate wirings 916 are provided. The emitter electrode 909 is an electrode conducting to N+ emitter region 904 and P+ emitter region 900 within a range of contact opening 908. The gate wiring 916 conducts with gate electrodes 906 in other position than shown. Gate electrodes 906 and gate wiring 916 are insulated from other parts by interlayer insulating film 907. Beneath the semiconductor substrate, collector electrode 910 is provided.

In this structure, when a power voltage is applied between the emitter electrode 909 and collector electrode 910, by on/off switching of gate voltage to gate electrodes 906, current between the emitter electrode 909 and the collector electrode 910 can be switched. Herein, contact opening 908 which is a contact region between the emitter region (N+ emitter region 904 and P+ emitter region 900) and emitter electrode 909 is formed in a rectangular shape in FIG. 19. This is intended to increase the area of the contact opening 908 and heighten the latch-up resistance while avoiding short-circuiting to gate electrodes 906 and gate wirings 916.

Patent reference 1, Japanese Patent Publication No. H6-101565

Patent reference 2, Japanese Laid-open Patent No. H10-229191

Such conventional semiconductor device, however, had a problem of local heating after switching off. The cause lies in the shape of the contact opening 908. That is, after switching off, as indicated by arrow I in FIG. 21, hole current from P field region 911 flows into the emitter electrode 909. As shown in FIG. 22, this hole current density is high at four corners of the rectangular contact opening 908. There is no contact opening 908 in a region between devices, and holes in the P field region 911 are directed toward the nearest contact opening 908. As a result, when interrupting a large current, in particular, the device may be destructed due to excessive heat generation. This phenomenon is prominent at corners of terminal end of device array.

As means for lessening concentration of current, simply, it may be considered to increase the area of contact opening 908. But it is limited in relation to insulation from gate electrodes 906 and others. If the contact opening 908 is excessively increased in area, holes may pass through the emitter electrode 909 too much in ON state. As a result, ON voltage becomes higher. It is hence difficult to increase the area of the contact opening 908.

The present invention is devised to solve these problems of the conventional semiconductor device. It is hence an object thereof to present a semiconductor device capable of stable operation of large current by lessening current concentration at corners of contact opening after switching off and suppressing local heat generation, without heightening ON voltage.

DISCLOSURE OF THE INVENTION

The semiconductor device of the present invention devised to solve the problems comprises an active device provided in a semiconductor substrate facing its principal plane, and a contact electrode provided outside of the semiconductor substrate conducting with the active device. It is a feature (1) herein that a marginal corner of conducting portion of the active device and the contact electrode is formed with a curved line or with an obtuse angle.

In this semiconductor device, when the active device is switched off, residual carriers in the active device escape to the contact electrode. This current escaping route is limited to the conducting portion of the active device and the contact electrode. Herein, since the marginal corner of the conducting portion is formed with a curved line or with an obtuse angle, the current of the conducting portion into the corner is dispersed somewhat. Hence, current density is not excessively high at the apex of edge. Hence, damage by heat generation is small. On the other hand, the ON voltage is not particularly high. This is because area of the conducting portion is not increased. Hence, carriers do not pass too much into the contact electrode in ON state.

The semiconductor device of the present invention may have, instead of the feature (1) above, a feature (2) of the shape of conducting portion of the active device and contact electrode formed in a broader width in an end portion than in the central portion. As a result, current concentration in the end portion of conducting portion is lessened. This is because area of the end portion is slightly wider. On the other hand, area of the entire conducting portion is not so much wider. This is because width is not large in the central area. Accordingly, prevention of local heat generation after switching off and low ON voltage in ON state are realized.

Further, the semiconductor device of the invention may have, instead of the feature (1) or (2), a feature (3) that impurity concentration is lower at an end portion of conducting portion of the active device and the contact electrode than in the central portion of it. As a result, current concentration at the end portion of conducting portion is lessened. This is because the end portion with lower impurity concentration has a higher resistance, so that current is more likely to flow into the central portion with lower resistance. On the other hand, area is not increased in the entire conducting portion. To the contrary, since the end portion has a higher resistance, the entire conducting portion has a slightly increased resistance. Therefore, local heat generation after switching off is prevented, while the ON voltage in ON state is low.

Generally, in this kind of semiconductor device, a plurality of active devices are discretely arranged in a semiconductor substrate, and each active device has a conducting portion to a contact electrode. In such configuration, it is not necessary that one of the features of (1) to (3) is realized in contacting portions of all active devices. It is sufficient that a feature is realized in contacting portions of some of the active devices. In such a case, it is particularly beneficial to realize one of the features (1) to (3) in the conducting portions of the active devices located at ends. This is because current from peripheral regions of the semiconductor substrate is also concentrated in the conductive portions of active devices located at ends. Therefore, as compared with active devices located in central area, the situation is severer as for current concentration after switching off. This phenomenon is particularly notable in the corner portion or end portion at the opposite side to other active devices. This is because distance from the peripheral region is very close for such corner portions.

The invention is particularly significant when applied in an insulated gate field-effect semiconductor device comprising an insulated gate insulated from an active device, and a field semiconductor region between active devices, for switching an active device by a voltage applied to the insulated gate. In such semiconductor device, generally, the field semiconductor region does not contact directly with the contact electrode. The position immediately above the field semiconductor region is usually an area for wiring to an insulated gate, and it is required to be insulated there from. Accordingly, after switching off, residual carriers in the field semiconductor region cannot directly escape to the contact electrode. Hence, by way of the nearest active device, they escape via its conducting portion to the contact electrode. As a result, current density is likely to be high in the marginal space of the conducting portion, in particular, in corner portion. By applying one of the features (1) to (3) in this area, damage by current concentration can be lessened. Generally, the field semiconductor region is low in impurity concentration, in the case of feature (3), at the end portion of the conducting portion, the field semiconductor region and contact electrode should directly contact with each other.

BEST MODE FOR CARRYING OUT THE INVENTION

Exemplary embodiments of the invention are specifically described below while referring to the accompanying drawings. In the following embodiments, the present invention is applied to an insulated gate field-effect semiconductor device used in switching of a large current.

First Embodiment

Figure 1:
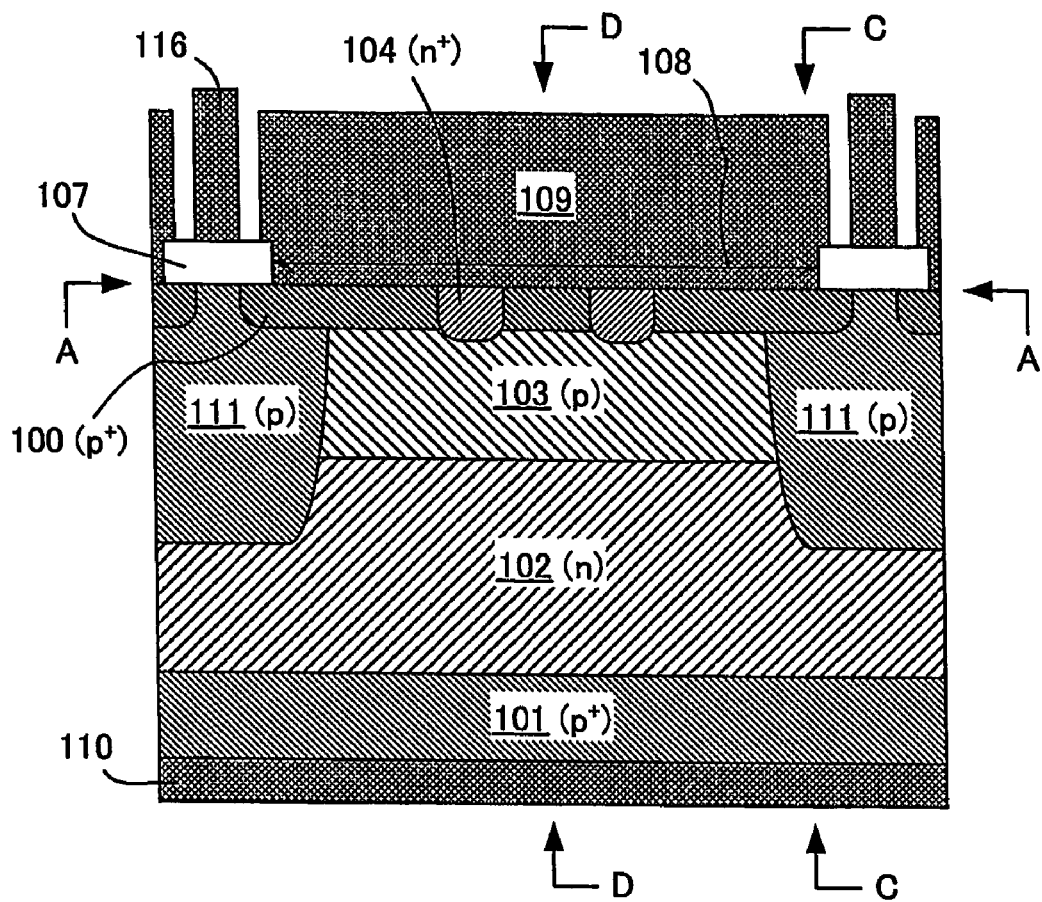
FIG. 1 is a sectional view (B-B in FIG. 2) showing a structure of insulated gate field-effect semiconductor device in a first embodiment.
Figure 2:
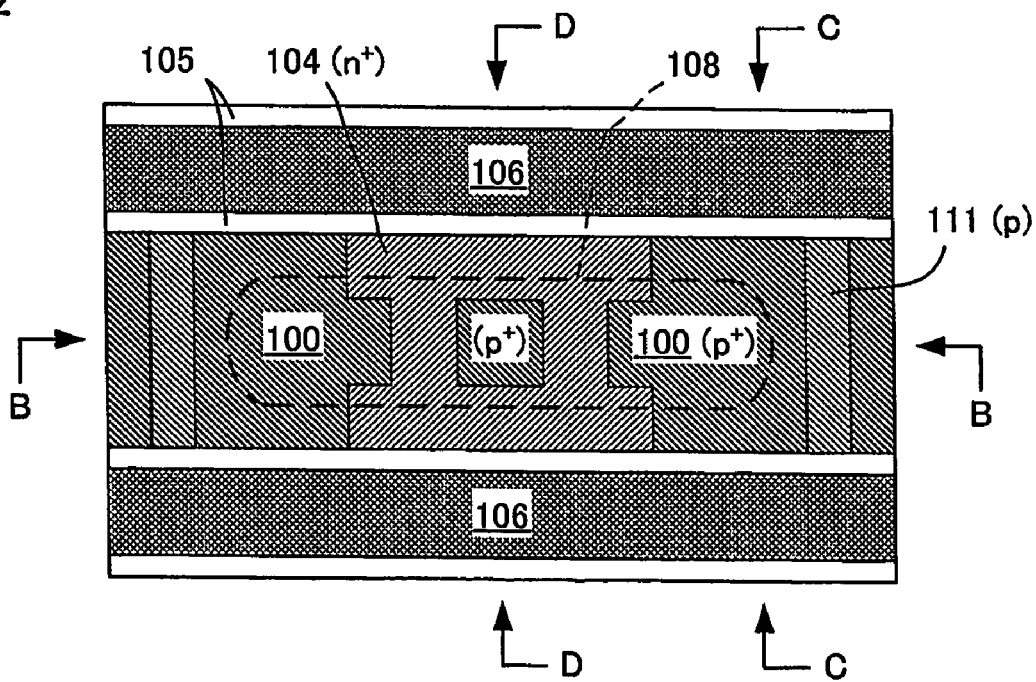
FIG. 2 is a sectional view (A-A in FIG. 1) showing the structure of insulated gate field-effect semiconductor device in the first embodiment.
Figure 3:
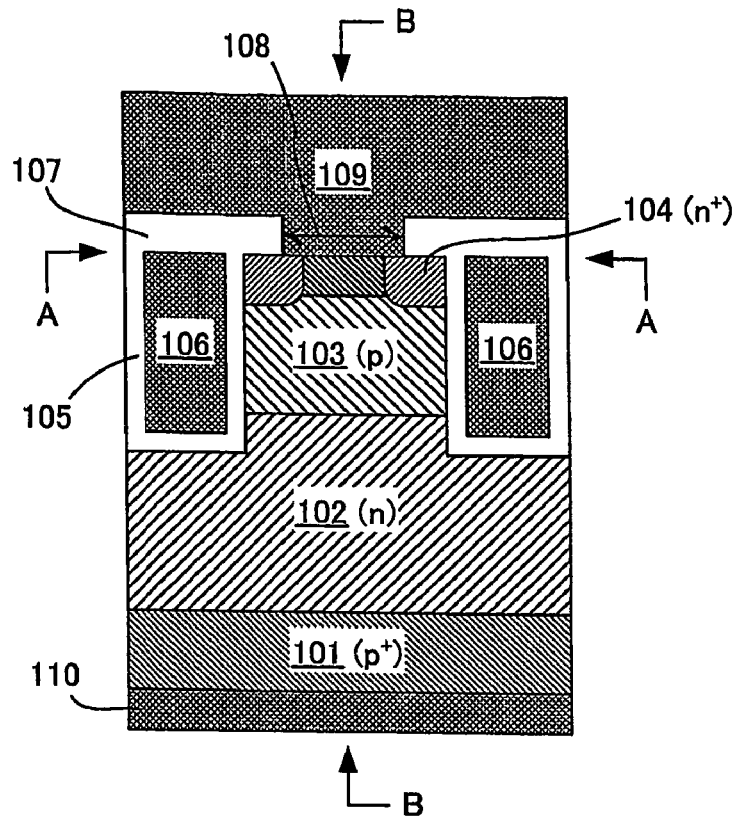
FIG. 3 is a sectional view (D-D in FIG. 1) showing the structure of insulated gate field-effect semiconductor device in the first embodiment.
Figure 4:
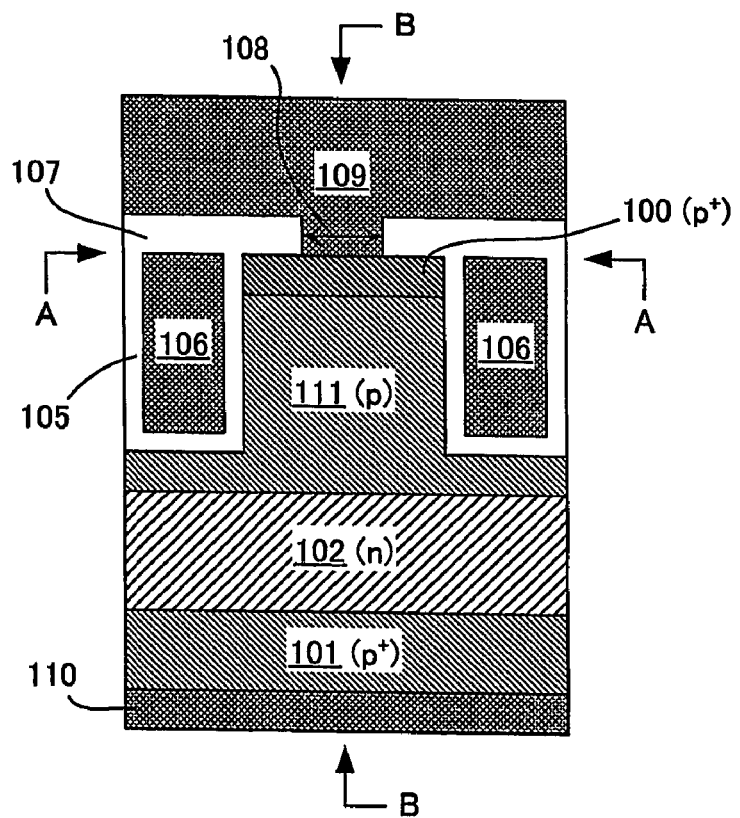
FIG. 4 is a sectional view (C-C in FIG. 1) showing the structure of insulated gate field-effect semiconductor device in the first embodiment.

A structure of an insulated gate field-effect semiconductor device according to a first embodiment is described by referring to FIG. 1 to FIG. 4. FIG. 1, FIG. 3, and FIG. 4 are longitudinal sectional views, and FIG. 2 is a plan sectional view at level A-A in these drawings. FIG. 1 is a sectional view of position B-B in FIG. 2 to FIG. 4. FIG. 3 is a sectional view of position D-D in FIG. 1 and FIG. 2. FIG. 4 is a sectional view of position C-C in FIG. 1 and FIG. 3.

In the insulated gate semiconductor device shown in FIG. 1 to FIG. 4, on the principal plane of level A-A side of semiconductor substrate, N+ emitter region 104 of high impurity concentration and P+ emitter region 100 of high impurity concentration are provided. Contacting with the lower part of them, P body region 103 is disposed. Further beneath the P body region 103, N drift region 102 is provided, and P+ collector region 101 is provided furthermore beneath. So far is within a semiconductor substrate. In the semiconductor substrate, still more, P field regions 111 for dividing individual devices are formed from the level A-A side. The bottom of the P field region 111 reaches into the N drift region 102. Impurity concentration of P field region 111 is lower than impurity concentration of P+ emitter region 100.

Part of the semiconductor substrate is dug in from the level A-A side, and gate electrodes 106 of trench structure are formed in the cavity. Gate electrodes 106 are insulated from the regions within the semiconductor substrate by gate insulating films 105. The shape within the plane of a gate electrode 106 is long in the lateral direction in FIG. 2, and multiple gate electrodes 106 are formed parallel and at equal intervals. Bottom of gate electrodes 106 is deeper than the bottom of the P body region 103, but is shallower than the bottom of the P field region 111. That is, the structure of the semiconductor device is schematically described as follows. By the trench structure of gate electrodes 106, the level A-A side of the semiconductor substrate is divided like ridges, and each ridge is divided into multiple cells by the P field region 111. Each cell composes an insulated gate transistor having an emitter (N+ emitter region 104 and P+ emitter region 100) and body (P body region 103). On the whole, the semiconductor device has a multiplicity of insulated gate transistors disposed discretely.

Above the level A-A side principal plane of the semiconductor substrate, emitter electrode 109 and gate wirings 116 are provided. The emitter electrode 109 contacts with the emitter (N+ emitter region 104 and P+ emitter region 100) in each cell. The contacting portion is a contact opening 108. As clear from FIG. 2, in the contact opening 108, both N+ emitter region 104 and P+ emitter region 100 contact with the emitter electrode 109. More specifically, the portions at both ends in the lateral direction in FIG. 2 in the contact opening 108 are occupied by the P+ emitter regions 100. On the other hand, the N+ emitter regions 104 are present in the central part in the lateral direction. Between contact opening 108 and contact opening 108, that is, in the position (see FIG. 1) under the gate wiring 116, in part, the P field region 111 has reached the level A-A of the semiconductor substrate.

The gate wiring 116 is connected to gate electrodes 106 in other position than shown. As a result, a voltage can be applied to gate electrodes 106. Gate electrodes 106 and gate wiring 116 are insulated from other parts by an interlayer insulating film 107. A collector electrode 110 is provided on the surface at the side of the P+ collector region 101 of the semiconductor substrate. A power voltage is applied between the emitter electrode 109 and collector electrode 110. In this structure, whether gate voltage is applied or not to gate electrodes 106, current between the emitter electrode 109 and the collector electrode 110 can be controlled by on/off switching.

In the insulated gate transistor of the embodiment, as shown in FIG. 2, a feature lies in the plane shape of the contact opening 108. That is, while it was rectangular in the prior art (see FIG. 19), but in the embodiment edges at four corners are formed in curved lines. As a result, right-angle apexes are eliminated.

The insulated gate transistor of the embodiment operates as follows. That is, the insulated gate transistor of the embodiment is used in a state of a power voltage applied between the emitter electrode 109 and the collector electrode 110. In this state, however, current does not flow between the emitter electrode 109 and the collector electrode 110. This is because the PN junction between the P body region 103 and N drift region 102 is biased inversely. That is, this is an OFF state. When a gate voltage is applied to gate electrodes 106, N channels are formed by field effect on faces facing to gate electrodes 106 in P body regions 103. As a result, an electron conducting route is connected from N emitter region 104 to N channel formed in P body region 103, and to N drift region 102, and current flows between the emitter electrode 109 and the collector electrode 110. This is an ON state. When the gate voltage is cut off, it goes back to OFF state again.

In ON state, holes flow into a P field region 111 from N drift regions 102 etc. As a result, the P field regions 111 is considerably high in hole concentration. When being switched off, holes accumulated in the P field region 111 are moved to escape to the emitter electrode 109. However, the P field region 111 does not contact directly with the emitter electrode 109. Accordingly, hole current from the P field region 111 escapes via the contact opening 108 to the emitter electrode 109 by way of the P+ emitter region 100.

Figure 5:
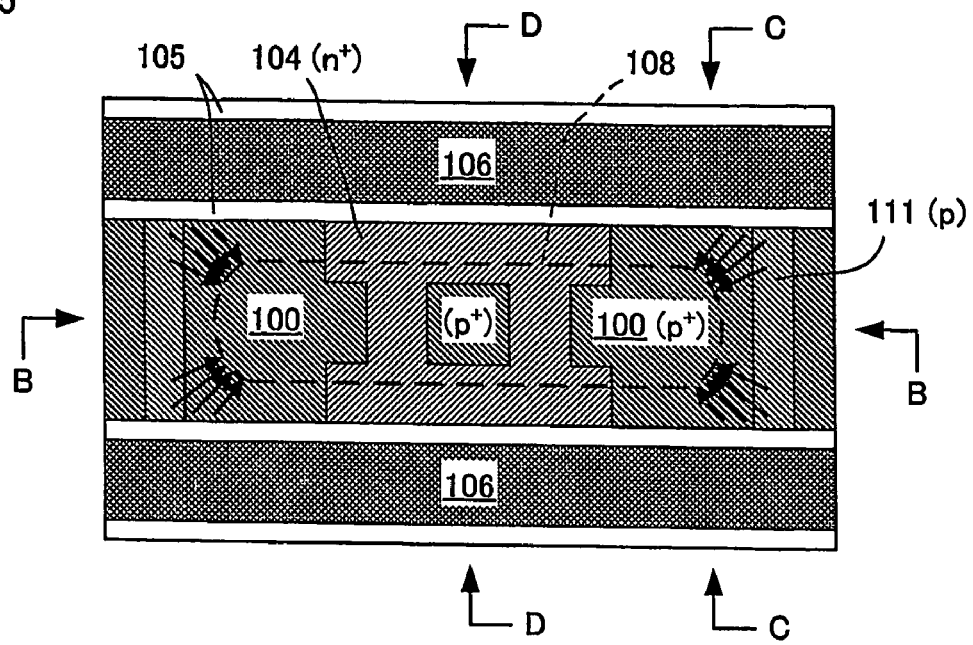
FIG. 5 is a conceptual diagram showing distribution of hole current after switching off of insulated gate field-effect semiconductor device in the first embodiment.
Figure 22:
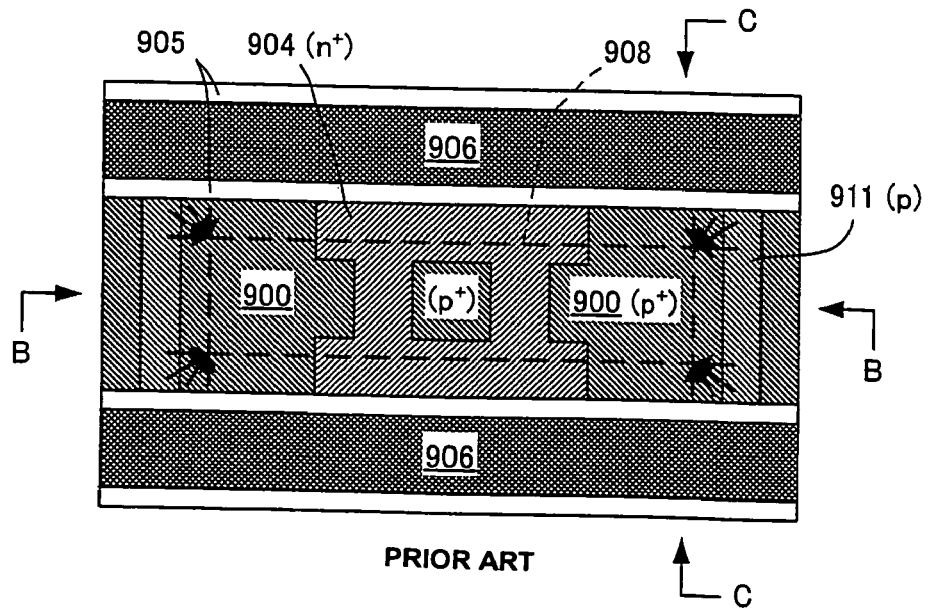
FIG. 22 is a conceptual diagram (part 2, section A-A) showing distribution of hole current after switching off of insulated gate field-effect semiconductor device in the prior art.

In the gate insulated transistor of the embodiment, the plane shape of the contact opening 108 brings about following merits. That is, there is little harm by concentration of hole current at corners of the contact opening 108. The reason is that the corners are formed with curved lines. In other words, since there is no right-angle apex at corners, hole current from the P field region 111 is dispersed in the entire curved line portions at corners as shown in FIG. 5. Therefore, even at the location of highest current density, the current density is lower as compared with that at corner apex in the conventional insulated gate transistor (see FIG. 22). Hence, excessive heat generation is not caused after switching off.

Figure 19:
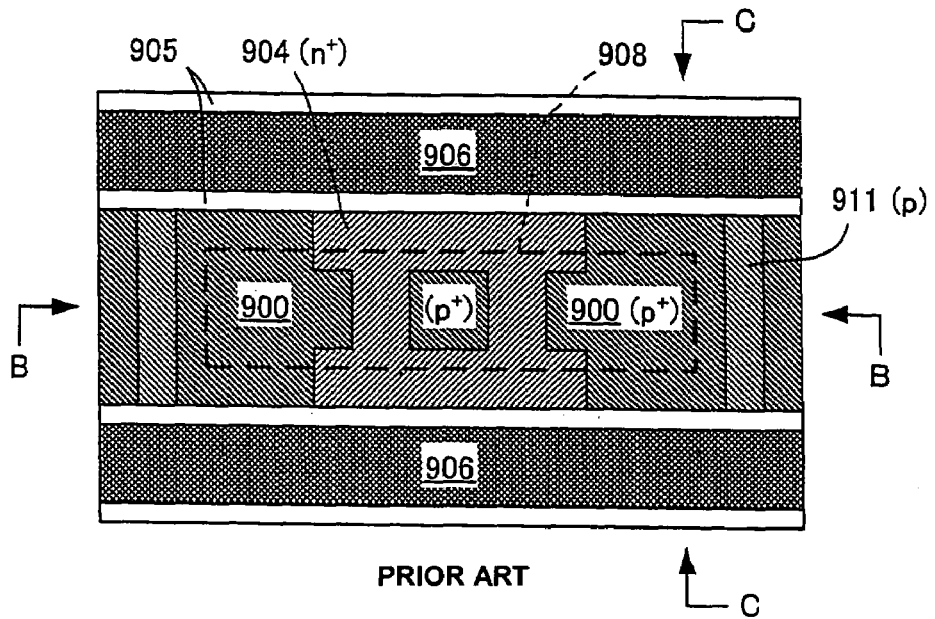
FIG. 19 is a section A-A view showing a structure of insulated gate field-effect semiconductor device in the prior art.
Figure 20:
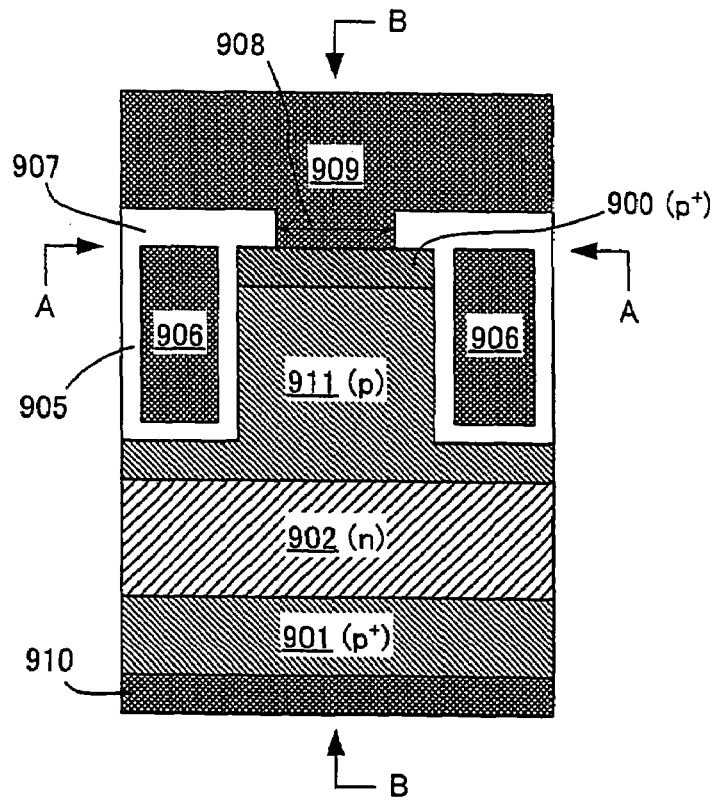
FIG. 20 is a section C-C view showing a structure of insulated gate field-effect semiconductor device in the prior art.
Figure 21:
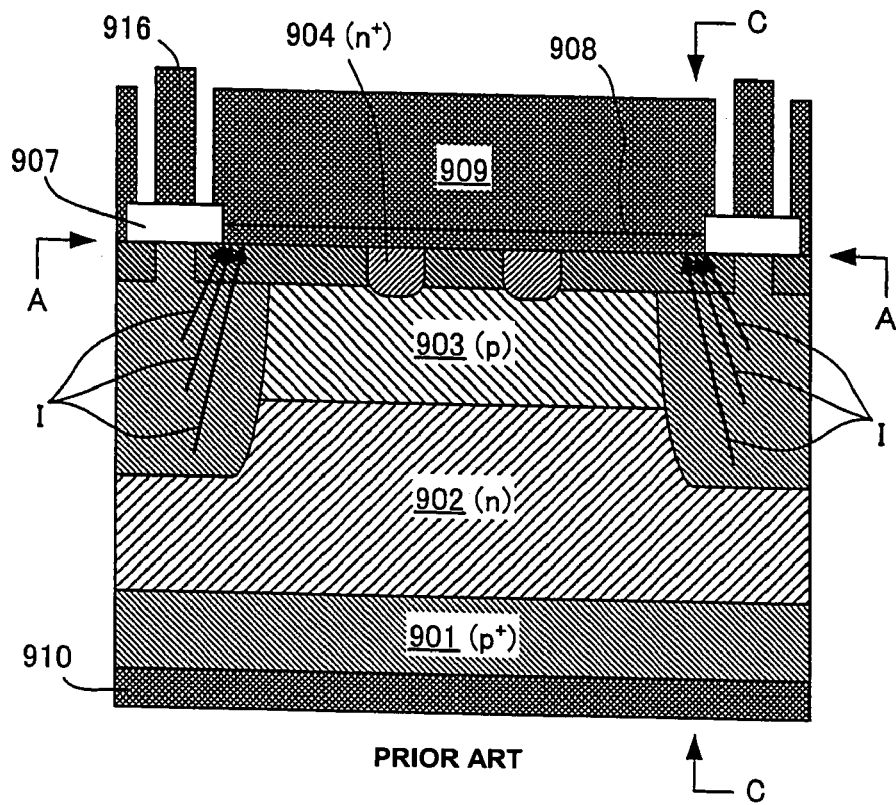
FIG. 21 is a conceptual diagram (part 1, section B-B) showing distribution of hole current after switching off of insulated gate field-effect semiconductor device in the prior art.

In addition, area of the contact opening 108 is not larger as compared with the rectangular contact opening 908 in FIG. 19. It is rather smaller. Hence, in ON state, holes do not escape to the emitter electrode 109 excessively. Therefore, carrier concentration in the device is kept high in ON state. As a result, ON voltage is low.

Figure 6:
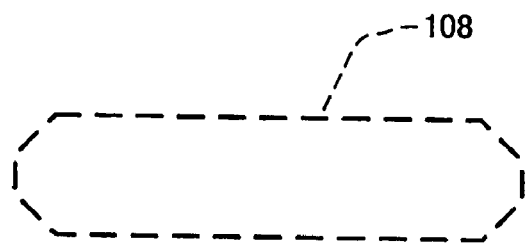
FIG. 6 is a diagram showing variation of plane shape of contact opening in the first embodiment.
Figure 7:
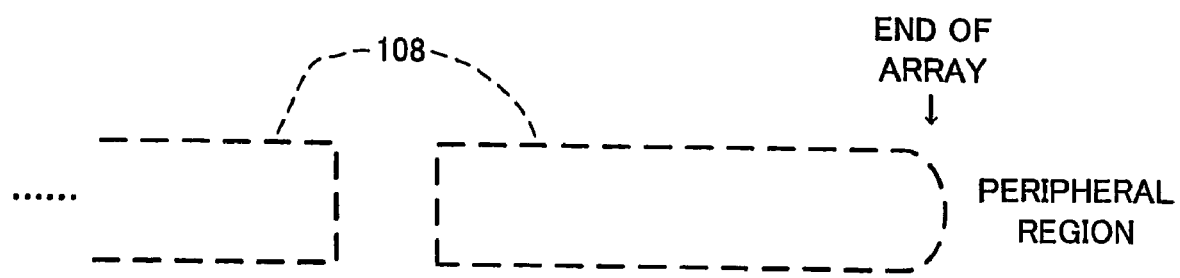
FIG. 7 is a diagram showing variation of a measure applied only in the edge of terminal end of device array in the first embodiment.
Figure 8:
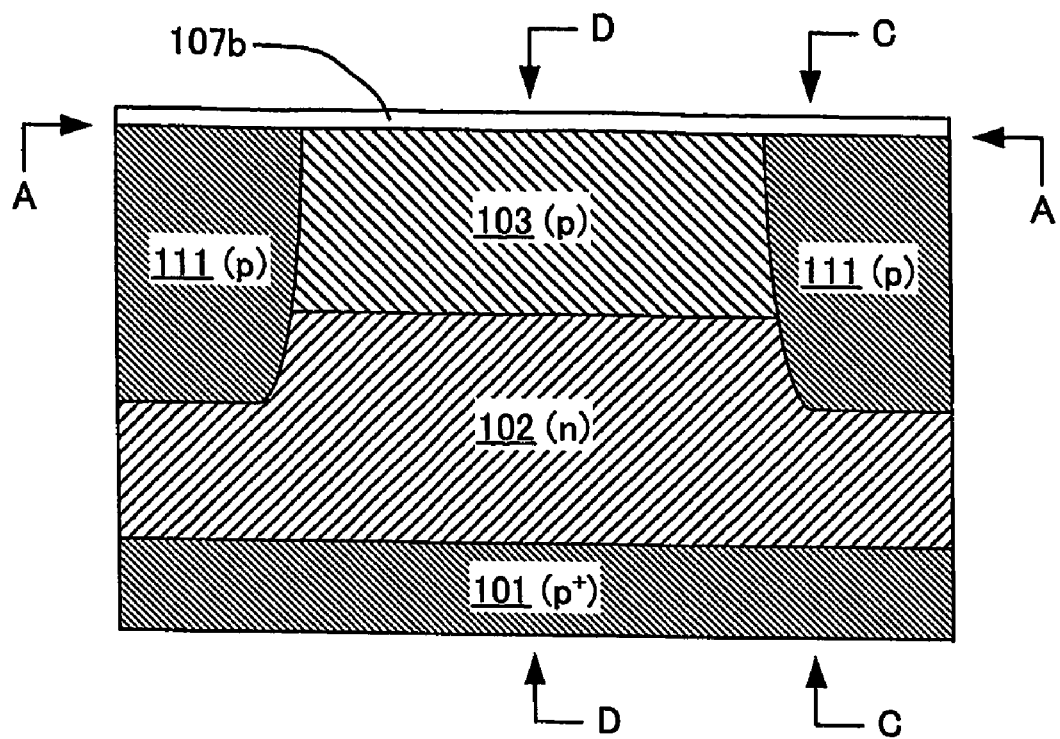
FIG. 8 is a sectional view (part 1, section B-B) showing a manufacturing process of insulated gate field-effect semiconductor device in the first embodiment.
Figure 23:
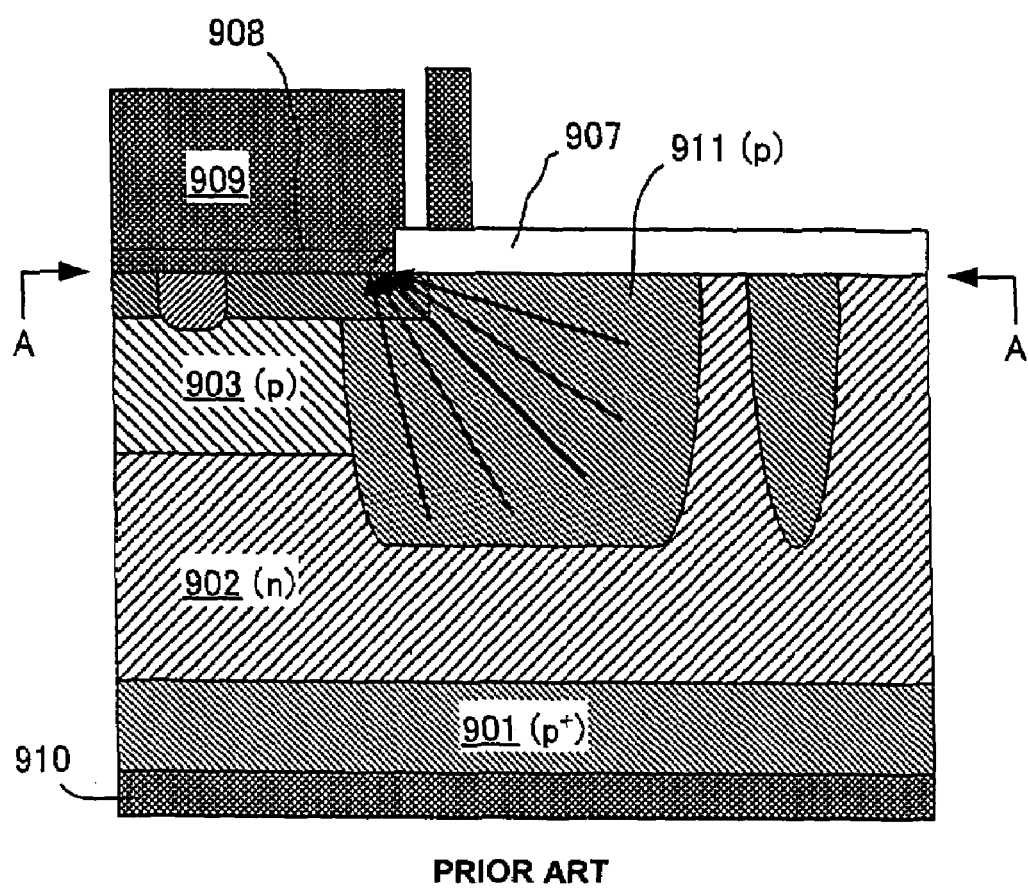
FIG. 23 is a conceptual diagram (part 3, section B-B at an end portion) showing distribution of hole current after switching off of insulated gate field-effect semiconductor device in the prior art.

Incidentally, in the gate insulated transistor of the embodiment, the shape of the contact opening 108 may be also formed by obtuse angles and straight lines at four corners as shown in FIG. 6. In such shape, as compared with the rectangular contact opening 908 in FIG. 19, concentration of current at corner apex is lessened. Further, the shape of the contact opening 108 may be formed by merely rounding the four corners of a rectangle. Such measure is not required in all four corners of the contact opening 108. For example, as shown in FIG. 7, if such measure is taken only at corners of terminal ends of the device array, a certain effect is expected. This is because, as explained in the prior art in FIG. 23, current concentration is likely to occur at corners of terminal ends of the device array.

Manufacturing process of gate insulated transistor of the embodiment is described by referring to FIG. 8 to FIG. 12. In manufacture of gate insulated transistor of the embodiment, a P+ silicon wafer is a start substrate. P+ silicon of this wafer becomes a P+ collector region 101. On its surface, an N type silicon layer is formed by epitaxial growth. This N type silicon layer becomes an N drift region 102. Entire single crystal silicon of the silicon wafer and a layer by epitaxial growth on it is called a semiconductor substrate in the present invention. Alternatively, an N silicon wafer may be used as a start substrate. In this case, the N silicon of the wafer is an N drift region 102. By introducing a P impurity from the back side surface, or by depositing a P silicon layer on the back side surface, a P+ collector region 101 can be formed.

Successively, on the surface of the N silicon layer, a thermal oxide film of 500 nm in thickness is formed. This thermal oxide film is patterned by photolithography and etching. As a result, the thermal oxide film is removed only in the portion for forming a P field region 111. By ion implantation, boron is injected at acceleration voltage of 60 keV. This ion implantation is a process for forming a P field region 111. Dose should be large enough to invert the N silicon layer in this range (N drift region 102) into the P type. By subsequent thermal diffusion, a P field region 111 is formed. The bottom depth of the P field region 111 is about 7 µm. Only in the device region but in the peripheral region, the oxide film is removed by wet etching by using hydrofluoric acid. By heating and oxidizing again, an oxide film 107b (see FIG. 8) of 50 nm in thickness is formed on the surface. At this stage, by ion implantation again, boron is injected at acceleration voltage of 60 keV. This ion implantation is a process for forming a P body region 103. Dose should be large enough to invert the N silicon layer in this range (N drift region 102) into the P type. By subsequent thermal diffusion, a P body region 103 is formed. The bottom depth of the P body region 103 is about 5 µm. A section B-B view at this stage is FIG. 8.

Figure 9:
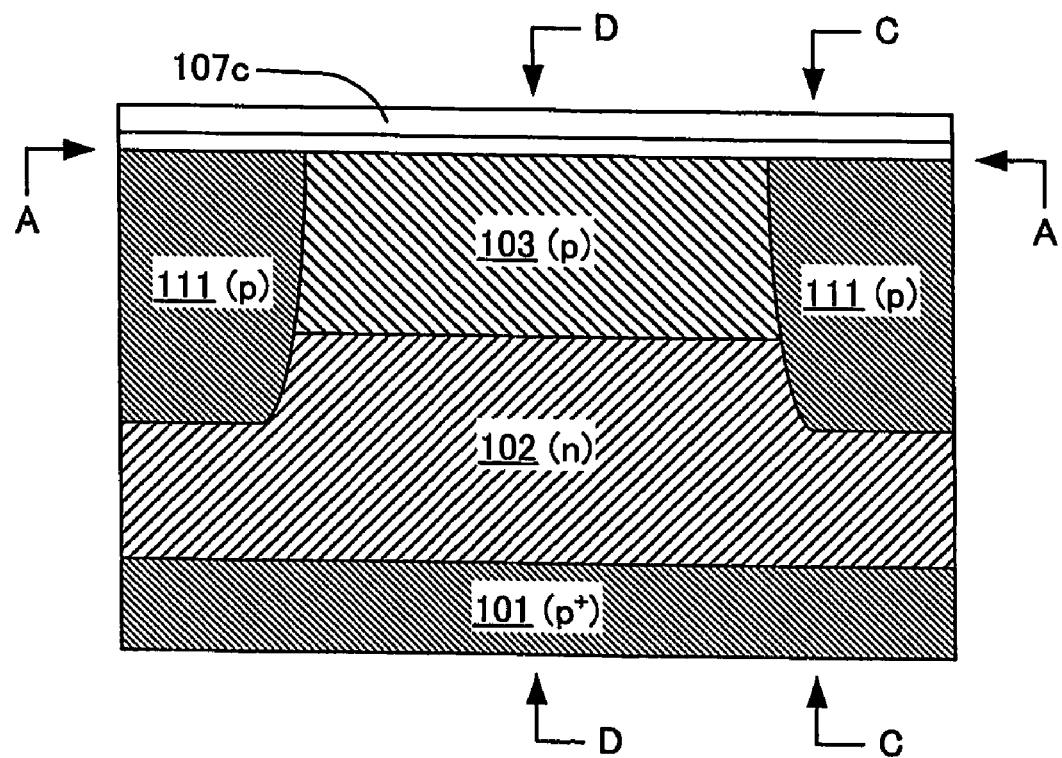
FIG. 9 is a sectional view (part 2, section B-B) showing a manufacturing process of insulated gate field-effect semiconductor device in the first embodiment.
Figure 10:
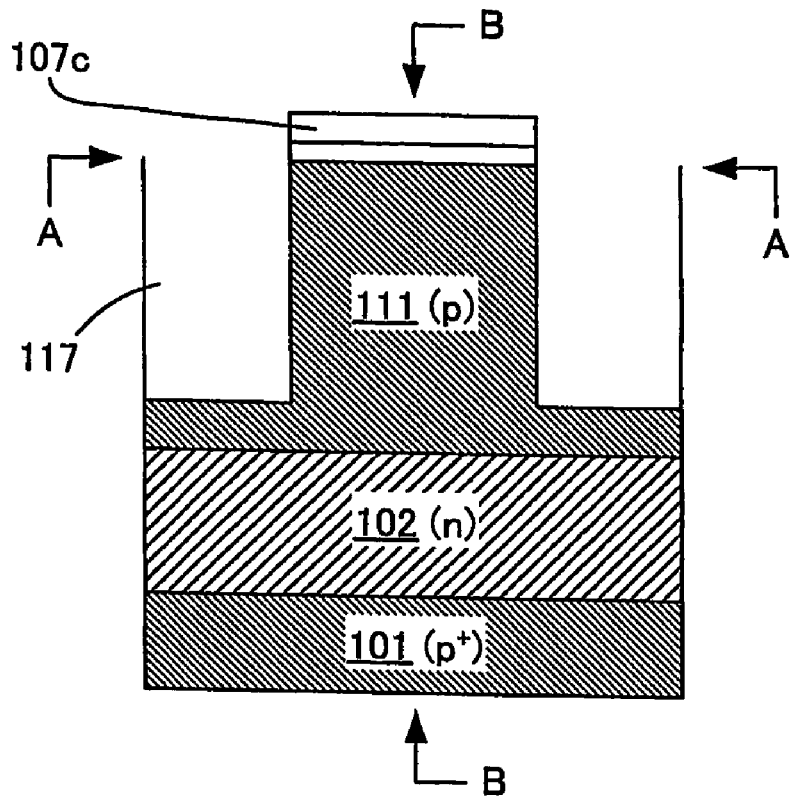
FIG. 10 is a sectional view (part 3, section C-C) showing a manufacturing process of insulated gate field-effect semiconductor device in the first embodiment.

On the oxide film 107b, an oxide film 107c is further deposited by CVD process (see FIG. 9, FIG. 10). Its thickness is 400 nm. The oxide films 107b and 107c are patterned by etching. The pattern to be formed is the pattern having openings in areas for forming gate electrodes 106. In this state, by dry etching of silicon, a trench opening 117 is formed. FIG. 9 is a section B-B view and FIG. 10 is a section C-C view at this stage.

Figure 11:
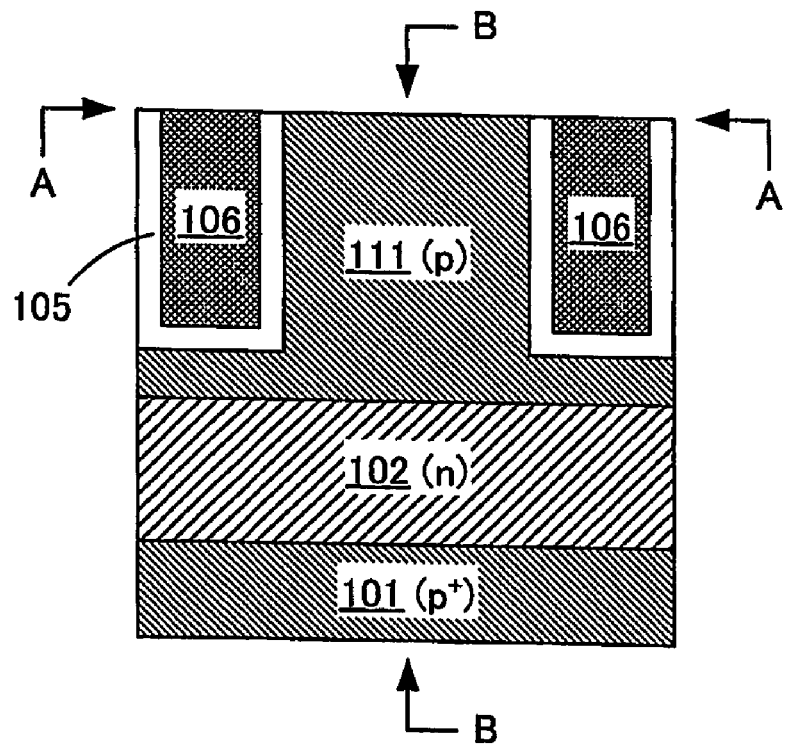
FIG. 11 is a sectional view (part 4, section C-C) showing a manufacturing process of insulated gate field-effect semiconductor device in the first embodiment.

Only in the device region but in the peripheral region, the oxide films 107b and 107c are removed by wet etching by using hydrofluoric acid. After that, by heating and oxidizing the surface of the semiconductor, a gate insulating film 105 (thickness 100 nm) is formed. After forming polycrystal silicon by CVD process, phosphorus is diffused to turn the polycrystal into N+ type. Of the formed N+ polycrystal silicon, the portion filling trench opening 117 is a gate electrode 106. The N+ polycrystal silicon on the surface of the semiconductor substrate is etched. That is, leaving the portion necessary for connection of gate electrodes 106 and gate wiring 116, the N+ polycrystal silicon on the surface is removed. FIG. 11 is a section C-C view at this stage.

Figure 12:
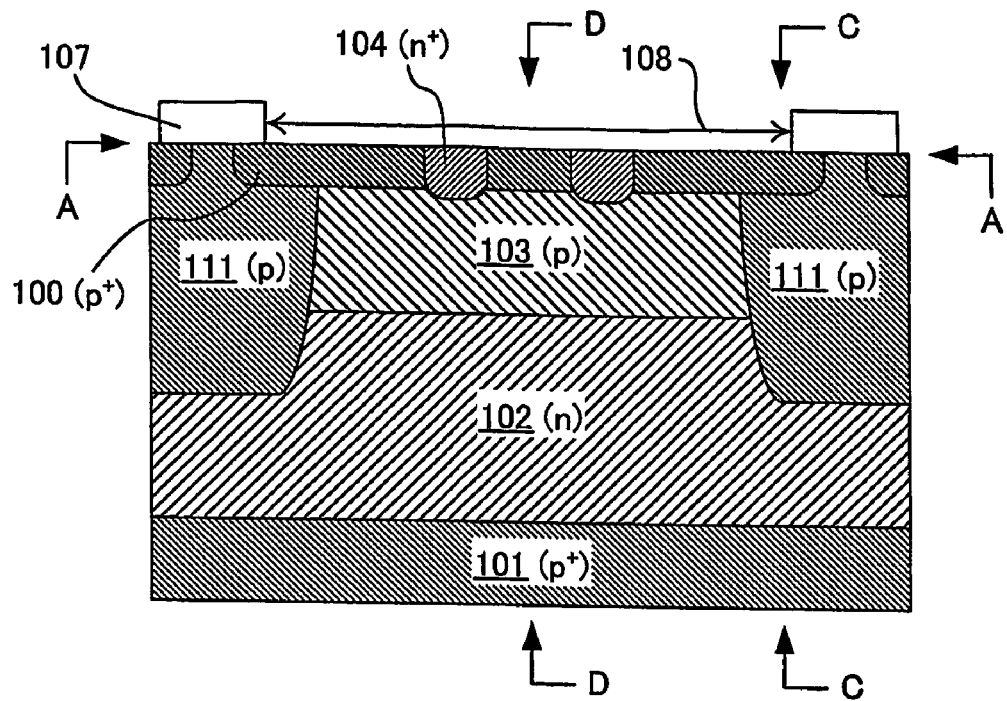
FIG. 12 is a sectional view (part 5, section B-B) showing a manufacturing process of insulated gate field-effect semiconductor device in the first embodiment.

Further, P+ emitter region 100 and N+ emitter region 104 are formed sequentially. These are formed by ion implantation and diffusion, respectively. Of course, proper pattern masks are used for ion implantations. After removing all pattern masks, an interlayer insulating film 107 (thickness 700 nm) is formed by CVD process. A pattern mask is formed on the interlayer insulating film 107, and the interlayer insulating film 107 is processed by dry etching, and a contact opening 108 is opened. FIG. 12 is a section B-B view at this stage. That is, the plane shape of the contact opening 108 is determined by the pattern mask used in processing of the interlayer insulating film 107. Then, by sputtering method, aluminium or other metal film is formed on the semiconductor substrate. By pattern etching of the film, an emitter electrode 109, a gate wiring 116, and other wirings are formed. At the back side, a collector electrode 110 is formed by sputtering method. Thus, the semiconductor device shown in FIG. 1 to FIG. 4 is fabricated.

Second Embodiment

Figure 13:
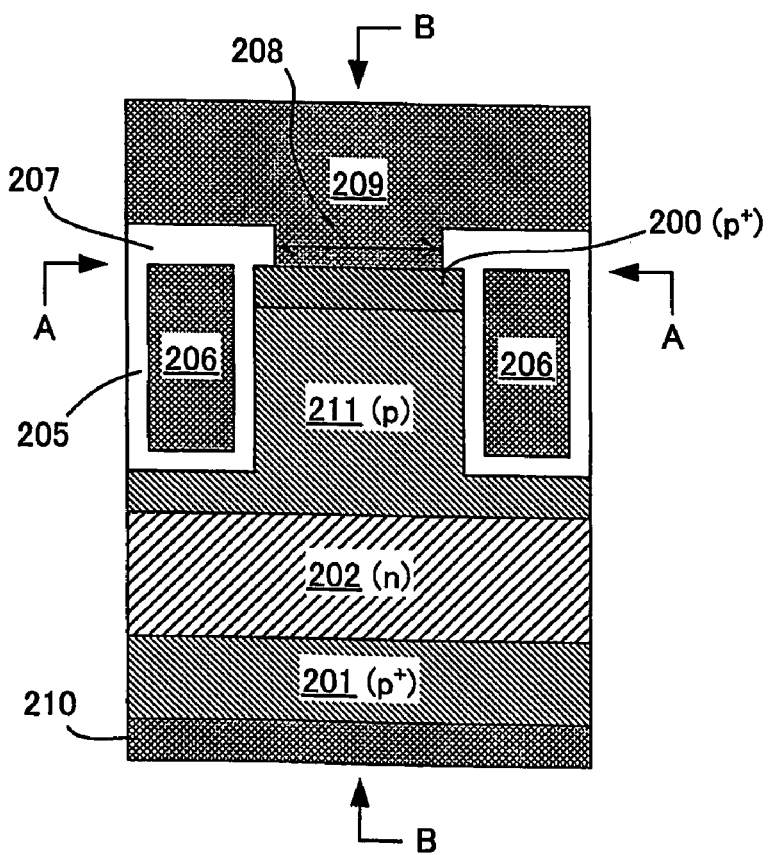
FIG. 13 is a sectional view (C-C in FIG. 14) showing a structure of insulated gate field-effect semiconductor device in a second embodiment.
Figure 14:
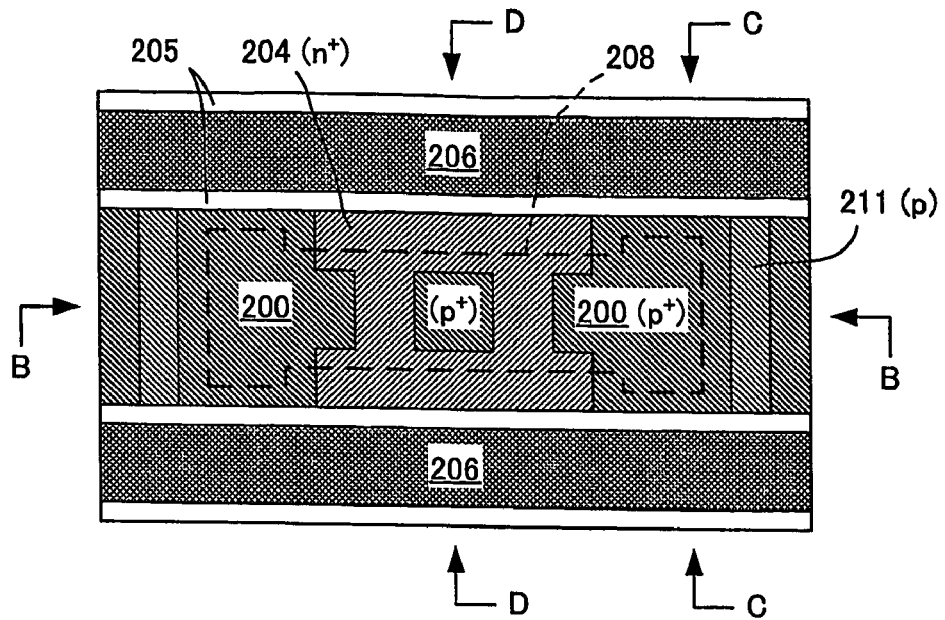
FIG. 14 is a sectional view (A-A in FIG. 13) showing a structure of insulated gate field-effect semiconductor device in the second embodiment.

A structure of an insulated gate field-effect semiconductor device according to a second embodiment is described by referring to FIG. 13 and FIG. 14. FIG. 13 is a longitudinal sectional view, and a plane sectional view at level A-A thereof is FIG. 14. FIG. 13 is a sectional view of position C-C in FIG. 14. A sectional view of position B-B in FIG. 13 and FIG. 14 is same as FIG. 1 relating to the first embodiment except that the reference numerals 1 are changed to 2. A sectional view of position D-D in FIG. 14 is same as FIG. 3 relating to the first embodiment except that the reference numerals are changed similarly. In the following explanation of the embodiment, when referring to FIG. 1 and FIG. 3, it is supposed that the reference numerals are changed in such manner.

In the insulated gate field-effect semiconductor device of the embodiment, what differs from the insulated gate field-effect semiconductor device of the first embodiment lies only in the plane shape of the contact opening 208. All other parts are common with the insulated gate field-effect semiconductor device in the first embodiment. The common points are quoted from the description of the first embodiment, and only the different point is explained.

The contact opening 208 in the insulated gate field-effect semiconductor device of this embodiment is basically a rectangular shape as shown in FIG. 14, with the width (vertical direction in FIG. 14) broader in the both end portions (position C-C) than in the central portion (position D-D). By defining in such shape, too, same as in the first embodiment, there is an advantage that harm by concentration of hole current after switching off is less. This is because the hole current from the P field region 211 to the emitter electrode 209 after switching off flows in the both end portions of the contact opening 208. Since this area is expanded in this embodiment, peak value of local current density is lower than in the prior art.

Area of the contact opening 208 is wider only slightly as compared with the rectangular contact opening 908 (FIG. 19) in the prior art. This is because the width is expanded only in both end portions. Accordingly, in ON state, holes do not escape to the emitter electrode 109 too much. Hence, the ON voltage is low.

Figure 15:
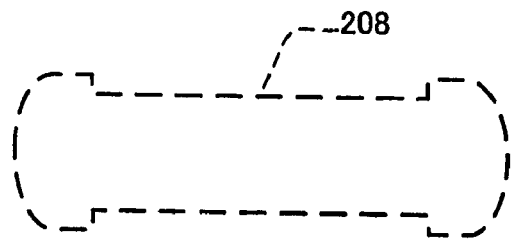
FIG. 15 is a diagram showing variation of plane shape of contact opening in the first embodiment.

In the insulated gate transistor of the embodiment, the shape of the contact opening 208 may be formed of curved lines at four corners as shown in FIG. 15. In this variation, the feature of this embodiment and the feature of the first embodiment are both realized. Therefore, current concentration is lessened more favorably. Of course, same as in the first embodiment, the four corners may be formed by obtuse angles and straight lines, or the four corners may be formed by merely rounding. Even if such measure is taken only at terminal ends of the device array, a certain effect is expected.

Manufacturing process of insulated gate transistor of the embodiment is similar to manufacturing process of insulated gate transistor of the first embodiment except that only the mask pattern (which determines the shape of the contact opening 208) is different when processing the interlayer insulating film 207 by dry etching. All other points are common.

Third Embodiment

Figure 16:
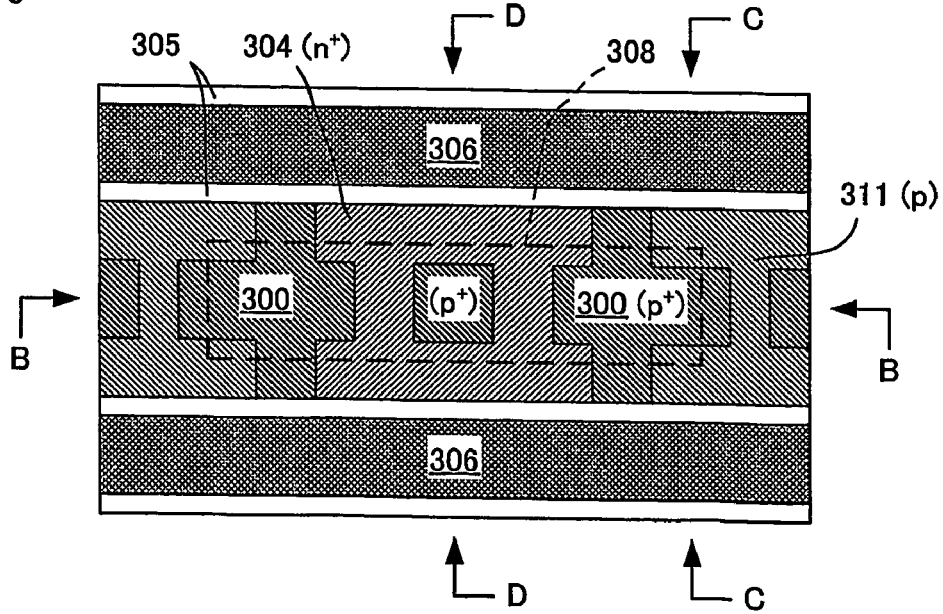
FIG. 16 is a sectional view (A-A in FIG. 17) showing a structure of insulated gate field-effect semiconductor device in a third embodiment.
Figure 17:
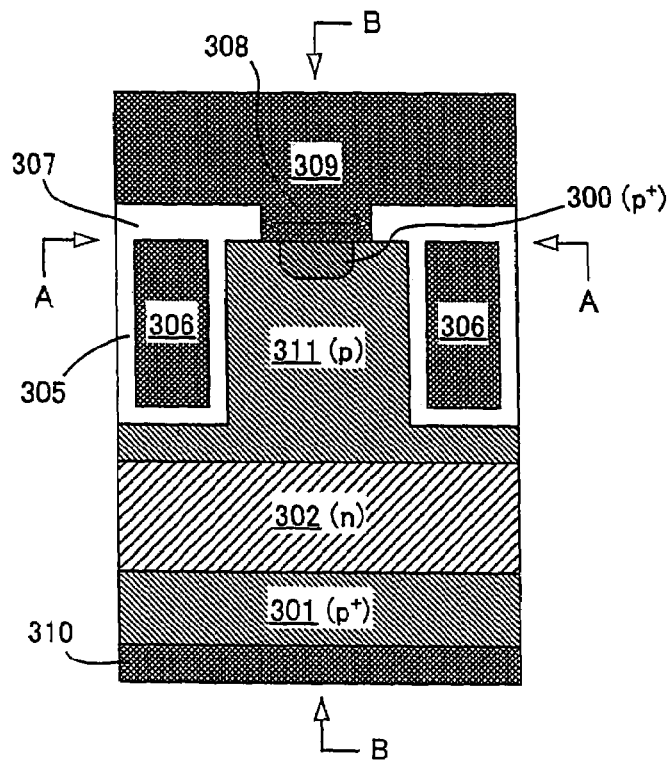
FIG. 17 is a sectional view (C-C in FIG. 16) showing a structure of insulated gate field-effect semiconductor device in the third embodiment.
Figure 18:
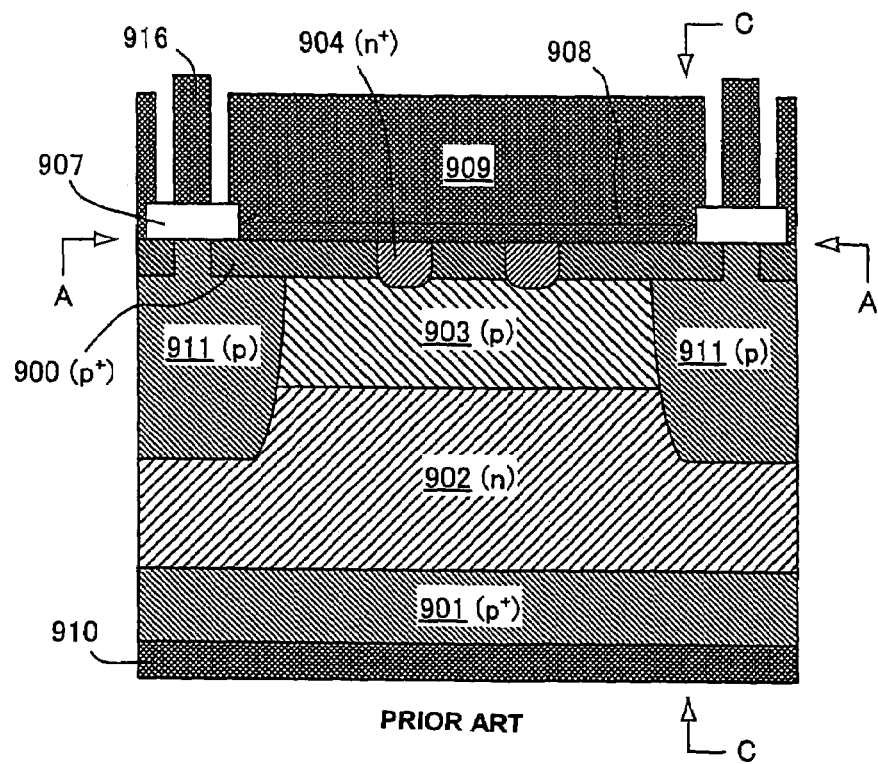
FIG. 18 is a section B-B view showing a structure of insulated gate field-effect semiconductor device in the prior art.

A structure of an insulated gate field-effect semiconductor device according to a third embodiment is described by referring to FIG. 16 and FIG. 17. FIG. 16 is a plane sectional view, and a longitudinal sectional view at position C-C thereof is FIG. 17. FIG. 16 is a sectional view of level A-A in FIG. 17. A sectional view of position B-B in FIG. 16 and FIG. 17 is same as FIG. 1 relating to the first embodiment except that the reference numerals 1 are changed to 3. A sectional view of position D-D in FIG. 16 is same as FIG. 3 relating to the first embodiment except that the reference numerals are changed similarly. In the following explanation of the embodiment, when referring to FIG. 1 and FIG. 3, it is supposed that the reference numerals are changed in such manner.

In the insulated gate field-effect semiconductor device of the embodiment, what differs from the insulated gate field-effect semiconductor device of the first embodiment lies only in the impurity concentration in the semiconductor region at four corners of the contact opening 308. The shape of the contact opening 308 itself is a rectangular shape same as in the prior art. Other parts are common with the insulated gate field-effect semiconductor device in the first embodiment. The common points are quoted from the description of the first embodiment, and only the different point is explained.

In the insulated gate field-effect semiconductor device of this embodiment, the plane shape of the P+ emitter region 300 is different from that of the first and second embodiments. More specifically, in this embodiment, the P+ emitter region 300 is not formed at four corners of the contact opening 308. In these portions, a P field region 311 with lower impurity concentration than in the P+ emitter region 300 contacts with the emitter electrode 309. Thus, same as in the first and second embodiments, there is an advantage that harm by concentration of hole current after switching off is less. This is because the P field region 311 is lower in impurity concentration as compared with the P+ emitter region 300 and is hence higher in resistance. Accordingly, part of hole current from the P field region 211 to the emitter electrode 209 after switching off tends to once leave the P field region 311 to the P+ emitter region 300 of lower resistance and escape from there into the emitter electrode 309, rather than escaping directly into the emitter electrode 309 from the P field region 311 of high resistance. Accordingly, the peak value of the local current density at the apices of four corners of the contact opening 308 is lower than in the prior art.

Area of the contact opening 308 is not changed from that of the rectangular contact opening 908 (FIG. 19) of the prior art. To the contrary, since a part is occupied by the P field region 311 of high resistance, the total resistance is slightly higher. Hence, in ON state, holes do not escape to the emitter electrode 309 too much. Hence, the ON voltage is low.

In the insulated gate transistor of the embodiment, the shape of the contact opening 308 may be formed of curved lines at four corners as shown in the first embodiment. In this variation, the feature of this embodiment and the feature of the first embodiment are both realized. Therefore, current concentration is lessened more favorably. Of course, same as in the first embodiment, the four corners may be formed by obtuse angles and straight lines, or the four corners may be formed by merely rounding. Or the shape of the contact opening 308 may be extended in the width in both end portions as shown in the second embodiment. In this variation, the feature of this embodiment and the feature of the second embodiment are both realized. Therefore, current concentration is lessened more favorably. Of course, all of the features of this embodiment, of the first embodiment, and of the second embodiment may be realized in one variation. Even if such measure is taken only at terminal ends of the device array, a certain effect is expected.

Manufacturing process of insulated gate transistor of the embodiment is similar to manufacturing process of insulated gate transistor of the first embodiment except that only the mask pattern (which determines the shape of the contact opening 208) is different when processing the interlayer insulating film 307 by dry etching, and that the mask pattern is different in ion implantation for forming P+ emitter region 300. All other points are common.

As specifically described herein, in the foregoing embodiments, the insulated gate transistors divided by the P field region, having the emitter, body, and collector, and controlling conduction between emitter and collector by voltage applied to the gate electrode, have at least one of the features (1) to (3) below. (1) The shape of the contact opening where the emitter region and the emitter electrode contact is formed in curved lines or obtuse angle at four corners. This eliminates right-angle apex. (2) The shape of the contact opening is basically a rectangular shape, formed in a wider shape in the both end portions than in the central portion. (3) The impurity concentration in the semiconductor region at four corners of the contact opening is lower than the impurity concentration in other parts than the four corners.

Accordingly, without increasing the ON voltage in ON state, local concentration of hole current into the emitter electrode from the field region after switching off is lessened. In particular, it is significant in the terminal end of the device array. Thus, the contradictory problems of low ON voltage and prevention of excessive heat generation after switching off are both solved.

The foregoing embodiments are mere examples, and are not intended to limit the invention what so ever. Therefore, the invention may be changed or modified freely within a range not departing from the true spirit thereof. For example, in the central portion of the contact opening 108 (the reference numeral in the first embodiment is cited herein, but it is same in other embodiments), the specific configuration of the N+ emitter region 104 and P+ emitter region 100 is not limited to the example shown in FIG. 2. It may be stripe type parallel or vertical to the gate electrode 106, ladder type, dot type, etc. The plane shape of the gate electrode 106 is not limited to rectangular shape, but may include polygonal, circular, elliptical or other shape. Accordingly, the contact opening 108 is not limited to stripe shape, but may be formed in dot shape. The structure of the gate electrode 106 includes, aside from the trench type, planar type, concave type and others. The material of the gate electrode 106 is not limited to N semiconductor, but may include P semiconductor or metals.

As for the internal structure of the semiconductor substrate, various modifications may be considered. For example, the impurity concentration in the N drift region 102 is not required to be uniform. It may be also formed as punch-through type forming an N+ buffer region of high concentration between the N drift region 102 and P+ collector region 101. Or it may be also formed as collector short type having the N drift region 102 or N+ buffer region partly short-circuited with the collector electrode 110. The type of the semiconductor device is not limited to the insulated gate transistor alone. For example, MOS control thyristor or diode may be used.

The conductive type (P type and N type) of the semiconductor regions may be exchanged. The semiconductor itself may be other than silicon (SiC, GaN, GaAs, etc.). The insulating film (gate insulating film 105, interlayer insulating film 107) is not limited to an oxide film, but a nitride film or composite film may be also used.

INDUSTRIAL APPLICABILITY

As clear from the description herein, the invention presents a semiconductor device lessened in current concentration at the corner of in the contact opening after switching off without heightening the ON voltage. As a result, suppressing local heat generation after switching off, a stable operation is realized at large current.

The invention claimed is:

1. A semiconductor device comprising:
an emitter region provided in a semiconductor substrate facing its principal plane,
a body region provided below the emitter region,
a drift region provided below the body region,
a gate electrode of trench structure, insulated from each of the emitter region, the body region, and the drift region,
a field region provided in the semiconductor substrate facing its principal plane, the field region being configured to divide the emitter region and the body region into cells, and
a contact electrode provided outside of the semiconductor substrate connecting with the emitter region and the field region,
wherein the emitter region, the body region, and the drift region constitute an insulated gate transistor divided by the field region,
the field region is the same conductive type as a portion of the emitter region that contacts with the field region, the field region being low in impurity concentration,
the field region contacts with the contact electrode at a corner portion of contacting portion of the semiconductor substrate to the contact electrode, and
the emitter region contacts with the contact electrode at another portion than the contacting portion of the field region to the contact electrode within the contacting portion of the semiconductor substrate to the contact electrode.

2. A semiconductor device of claim 1,
wherein a plurality of insulated gate transistors are discretely arranged in the semiconductor substrate, and each insulated gate transistor has a contacting portion to a contact electrode, and
a corner portion of a contacting portion of an insulated gate transistor positioned at the end and at opposite side to another insulated gate transistor is formed with a curved line or with an obtuse angle.

3. A semiconductor device of claim 1,
wherein the shape of contacting portion of the insulated gate transistor to the contact electrode is formed in a broader width in an end portion than in the central portion.

4. A semiconductor device of claim 3,
wherein a plurality of insulated gate transistors are discretely arranged in the semiconductor substrate, and each insulated gate transistor has a contacting portion to a contact electrode,
an end portion of a contacting portion of an insulated gate transistor positioned at an end and at opposite side of another insulated gate transistor is formed broader than the central portion of the contacting portion, and
a corner portion of the end portion is formed with a curved line or with an obtuse angle.

5. A semiconductor device comprising:
an emitter region provided in a semiconductor substrate facing its principal plane,
a body region provided below the emitter region,
a drift region provided below the body region,
a gate electrode of trench structure, insulated from each of the emitter region, the body region, and the drift region,
a field region provided in the semiconductor substrate facing its principle plane, the field region being configured to divide the emitter region and the body region into cells, and
a contact electrode provided outside of the semiconductor substrate conducting with the emitter region, the contact electrode having a corner portion,
wherein the emitter region, the body region, and the drift region constitute an insulated gate transistor divided by the field region,
the field region is the same conductive type as a portion of the emitter region that contacts with the field region, the field region being low in impurity concentration, and
a corner portion of a contacting portion of the emitter region mating with the corner portion of the contact electrode has an impurity concentration that is lower at the corner portion of the contacting portion than in other portions of the contacting portion.

6. A semiconductor device of claim 5,
wherein a plurality of insulated gate transistors are discretely arranged in the semiconductor substrate, and each insulated gate transistor has a contacting portion to a contact electrode, and
a corner portion of a contacting portion of an insulated gate transistor positioned at an end and at opposite side of another insulated gate transistor is lower in impurity concentration than other portion of the contacting portion.

* * * * *

UNITED STATES PATENT AND TRADEMARK OFFICE
CERTIFICATE OF CORRECTION

PATENT NO.        : 7,579,652 B2                                               Page 1 of 1
APPLICATION NO.   : 10/562839
DATED             : August 25, 2009
INVENTOR(S)       : Katsuhiko Nishiwaki It is certified that error appears in the above-identified patent and that said Letters Patent is hereby corrected as shown below:

| Column | Line |  |
|--------|------|--|
| 12     | 27   | Change "principle" to --principal--. |

Signed and Sealed this

Sixteenth Day of February, 2010

David J. Kappos
*Director of the United States Patent and Trademark Office*